(12) United States Patent
Papandreou et al.

(10) Patent No.: US 10,395,734 B2
(45) Date of Patent: *Aug. 27, 2019

(54) METHOD AND APPARATUS FOR DETERMINING A CELL STATE OF A RESISTIVE MEMORY CELL

(71) Applicant: International Business Machines Corporation, Armonk, NY (US)

(72) Inventors: Nikolaos Papandreou, Thalwil (CH); Charalampos Pozidis, Thalwil (CH); Milos Stanisavljevic, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/605,936

(22) Filed: May 25, 2017

(65) Prior Publication Data

US 2017/0330616 A1 Nov. 16, 2017

Related U.S. Application Data

(63) Continuation of application No. 14/744,013, filed on Jun. 18, 2015, now Pat. No. 9,666,273.

(51) Int. Cl.
*G11C 13/00* (2006.01)
*G11C 11/56* (2006.01)
*G11C 7/06* (2006.01)

(52) U.S. Cl.
CPC ........ *G11C 13/004* (2013.01); *G11C 11/5678* (2013.01); *G11C 7/062* (2013.01);
(Continued)

(58) Field of Classification Search
CPC .................. G11C 13/004; G11C 7/062; G11C 2013/0045; G11C 2013/0054
See application file for complete search history.

(56) References Cited

U.S. PATENT DOCUMENTS 7,426,134 B2 9/2008 Happ et al.
7,724,596 B1 5/2010 Sutardja et al.
(Continued)

OTHER PUBLICATIONS

A. Athmanathan and G. F. Close, a 7-bit Readout Circuit in 90 nm CMOS for Drift-Resilient Multi-Level Phase-Change Memory. IBM, E*PCOS2011. p. 1-2,2011.
(Continued)

*Primary Examiner* — Mushfique Siddique
(74) *Attorney, Agent, or Firm* — Daniel P. Morris; Otterstedt, Wallace & Kammer, LLP

(57) ABSTRACT

A sensing circuit senses a sensing voltage of a resistive memory cell and outputs a resultant value in response to the sensing voltage which is indicative for the actual cell state. A settling circuit includes a plurality of current mirrors for settling the sensing voltage to a certain target voltage representing one of M programmable cell states. A prebiasing circuit is provided for prebiasing a bitline capacitance of the resistive memory cell such that the sensing voltage is close to the certain target voltage. A resistance circuit includes a plurality of resistors connected in series and coupled in parallel to the resistive memory cell. The resistance circuit is configured to reduce an effective resistance seen by the prebiasing circuit. The settling circuit and the resistance circuit are configured to form a plurality of current-resistor pairs switchable to define a linear range detection currents corresponding to the certain target voltages.

14 Claims, 3 Drawing Sheets

(52) U.S. Cl.
CPC .. *G11C 13/0004* (2013.01); *G11C 2013/0045* (2013.01); *G11C 2013/0054* (2013.01); *G11C 2213/79* (2013.01)

(56) References Cited

U.S. PATENT DOCUMENTS

| | | | |
|---|---|---|---|
| 8,755,214 | B2 | 6/2014 | Frey et al. |
| 9,300,318 | B1* | 3/2016 | Medina Sanchez-Castro ............ H03M 1/0863 |
| 9,343,148 | B2* | 5/2016 | Papandreou ......... G11C 13/004 |
| 9,520,189 | B1* | 12/2016 | Papandreou ....... G11C 13/0033 |
| 9,666,273 | B2* | 5/2017 | Papandreou ......... G11C 13/004 |
| 2005/0249006 | A1 | 11/2005 | Tran et al. |
| 2006/0034112 | A1 | 2/2006 | Oh et al. |
| 2007/0140029 | A1 | 6/2007 | Kim et al. |
| 2008/0025089 | A1 | 1/2008 | Scheuerlein et al. |
| 2008/0080228 | A1 | 4/2008 | Nirschl et al. |
| 2008/0165570 | A1* | 7/2008 | Happ ................. G11C 11/5678 365/163 |
| 2008/0239833 | A1 | 10/2008 | Nirschl et al. |
| 2008/0290906 | A1 | 11/2008 | Chou et al. |
| 2008/0316803 | A1 | 12/2008 | Lin et al. |
| 2009/0219749 | A1 | 9/2009 | Lamorey et al. |
| 2010/0103726 | A1* | 4/2010 | Bae ....................... G11C 5/143 365/163 |
| 2011/0103140 | A1* | 5/2011 | Chung .................... G11C 7/04 365/163 |
| 2011/0170332 | A1* | 7/2011 | Oh ......................... G11C 5/145 365/148 |
| 2012/0230081 | A1* | 9/2012 | Close .................... G11C 5/147 365/148 |
| 2012/0230097 | A1* | 9/2012 | Frey .................... G11C 11/5678 365/163 |
| 2012/0307554 | A1 | 12/2012 | Frey et al. |
| 2012/0314481 | A1 | 12/2012 | Close et al. |
| 2012/0327709 | A1 | 12/2012 | Frey |
| 2013/0040584 | A1 | 2/2013 | Bedeschi |
| 2013/0135924 | A1 | 5/2013 | Pantazi et al. |
| 2013/0322157 | A1 | 12/2013 | Papandreou et al. |
| 2015/0279458 | A1* | 10/2015 | Papandreou ......... G11C 13/004 365/163 |
| 2015/0287456 | A1 | 10/2015 | Papandreou et al. |
| 2016/0372187 | A1 | 12/2016 | Papandreou et al. |

OTHER PUBLICATIONS

H.-S. Philip Wong, Phase Change Memory. Proc. IEEE vol. 98, No. 12 2010 IEEE No. 12, Dec. 2010 | Proceedings of the IEEE, p. 2201-2227.

H.-S. Philip Wong, Metal-Oxide RRAM. Proc. IEEE vol. 100, No. 6, Jun. 2012 | Proceedings of the IEEE. pp. 1951-1970.

List of IBM Patents or Patent Applications Treated as Related, May 25, 2017, pp. 1-2.

* cited by examiner

METHOD AND APPARATUS FOR DETERMINING A CELL STATE OF A RESISTIVE MEMORY CELL

CROSS-REFERENCE TO RELATED APPLICATIONS

This application is a continuation of U.S. patent application Ser. No. 14/744,013 filed 18 Jun. 2015, the complete disclosure of which is expressly incorporated herein by reference in its entirety for all purposes.

BACKGROUND

The invention relates to a device and to a method for determining an actual cell state of a resistive memory cell having a plurality M of programmable cell states.

A prominent example for resistive memory cells having a plurality of programmable levels or states are Resistive Random Access Memory (RRAM) and Phase Change Memory (PCM). PCM is a non-volatile solid-state memory technology that exploits the reversible, thermally-assisted switching of specific chalcogenides between certain states of different electrical conductivity.

PCM is a promising and advanced emerging non-volatile memory technology mainly due to its excellent features including low latency, high endurance, long retention and high scalability. PCM may be considered a prime candidate for Flash replacement, embedded/hybrid memory and storage-class memory. Key requirements for competitiveness of PCM technology may be multi-level cell functionality, in particular for low cost per bit, high-speed read/write operations, in particular for high bandwidth and high endurance. Multilevel functionality, i.e. multiple bits per PCM cell, may be a way to increase storage capacity and thereby to reduce cost.

Multi-level PCM is based on storing multiple resistance levels between a lowest (SET) and a highest (RESET) resistance value. Multiple resistance levels or levels correspond to partial-amorphous and partial-crystalline phase distributions of the PCM cell. Phase transformation, i.e. memory programming, may be enabled by Joule heating. In this regard, Joule heating may be controlled by a programming current or voltage pulse. Storing multiple resistance levels in a PCM cell is a challenging task.

For example, in H.-S. P. Wong et al., Proc. IEEE, 2010 it is described that the multiple states or levels in a PCM cell are created by varying the programming power, thus creating different crystalline and amorphous fractions within the cell. Further according to H.-S. P. Wong et al., Proc. IEEE, 2012, in metal-oxide resistive memory devices, multiple states may correspond to variations in the gap between conductive oxygen-vacancy filaments and the electrodes.

As mentioned above, in resistive memory, the fundamental storage unit (referred to generally herein as the "cell") can be set to a number of different states which exhibit different electrical resistance characteristics. Information is recorded by exploiting the different states to represent different data values. To read recorded data, cell-state is detected via measurements which exploit the differing resistance characteristics to differentiate between possible cell-states. A variety of semiconductor memory technologies employ these basic principles for data storage. Examples include oxide-based memory such as resistive RAM and memristor memory, ionic-transport-based memory, and phase-change memory. The following discussion will focus on phase-change memory (PCM) as a particularly promising technology for future non-volatile memory chips. It is to be understood however, that PCM is only an illustrative application for the invention to be described which can be similarly applied to other resistive memory technologies.

Phase-change memory exploits the reversible switching of certain chalcogenide materials between at least two states with different electrical resistance. In so-called "single-level cell" (SLC) PCM devices, each cell can be set to one of two states, crystalline and amorphous, by application of heat. Each SLC cell can thus store one bit of binary information. However, to satisfy market demand for ever-larger memory capacity and reduce cost per bit, storage of more than one bit per cell is required. To achieve this, it is necessary that a cell can be set to s states where s>2, and that these states can be distinguished on readback via the cell resistance characteristics. Multi-level cell (MLC) operation has been proposed for PCM cells whereby each cell can be set to one of s>2 resistance levels, each corresponding to a different cell state. MLC operation is achieved by exploiting partially-amorphous states of the chalcogenide cell. Different cell states are set by varying the effective volume of the amorphous phase within the chalcogenide material. This in turn varies cell resistance.

To write data to a PCM cell, a voltage or current pulse is applied to the cell to heat the chalcogenide material to an appropriate temperature to induce the desired cell-state on cooling. By varying the amplitude of the voltage or current pulses, different cell-states can be achieved. Reading of PCM cells can be performed using cell resistance to distinguish the different cell-states. The resistance measurement for a read operation is performed in the sub-threshold region of the current-versus-voltage (IN) characteristic of the cell, i.e. in the region below the threshold switching voltage at which a change in cell-state can occur. The read measurement can be performed in a variety of ways, but all techniques rely fundamentally on either voltage biasing and current sensing, or current biasing and voltage sensing. In a simple implementation of the current-sensing approach, the cell is biased at a certain constant voltage level and the resulting cell current is sensed to provide a current-based metric for cell-state. U.S. Pat. No. 7,426,134 B2 discloses one example of a current-sensing technique in which the bias voltage can be set to successive higher levels, and the resulting cell-current compared to successive reference levels, for detecting the different cell-states. US Patent Application Publication No. 2008/0025089 discloses a similar technique in which the cell current is simultaneously compared with different reference levels. In the alternative, voltage-sensing approach, a constant current is passed through the cell and the voltage developed across the cell is sensed to provide a voltage-based metric for cell-state.

Reading of MLC cells is particularly challenging as the read operation involves distinguishing fine differences in cell resistance via the current/voltage measurements. Compared to SLC operation, these fine differences are more readily affected by random noise fluctuations and drift over time, resulting in errors when retrieving stored data. To counteract this loss of data integrity associated with MLC memory, new cell-state metrics, beyond simple resistance, have been proposed. The copending European Patent Application No. 10174613.9, filed 31 Aug. 2010, discloses a particularly promising metric which is based on the sub-threshold slope of the I/V characteristic of the cell. For example, the metric may be based on the difference between two read measurements of the same cell. This type of metric is less sensitive to noise and drift. In certain embodiments of this measurement technique, the metric is essentially a voltage based metric in the sense that it calls for the measurement of cell voltages (or cell voltage differences) at given bias currents. In general, voltage-based metrics are considered advantageous over current-based metrics, showing less drift over time, less susceptibility to noise, better SNR (signal-to-noise ratio), and allowing more intermediate levels to be packed into one cell. However, the conventional technique for obtaining voltage-based metrics, using current biasing and voltage sensing, is undesirably slow as explained above. This speed penalty associated with the conventional voltage measurement technique means that there is a fundamental conflict between the requirement for a fast random access of the memory and the need for voltage-based metrics supporting high density MLC memory.

Recapitulating, the readout of the cell state may be done via a current-based metric (see U.S. Pat. No. 7,426,134, US 2008/0239833, US 2008/0025089, and US 20070140029) or via a voltage-based metric (see US 2012/0307554; G. Close, C. Hagleitner, A. Pantazi, N. Papandreou, C. Pozidis and A. Sebastian, Cell-state determination in phase-change memory, US patent application filed under CH920100091US1, United States 2010; US 2008/0165570; US 20080316803; and US 2012/0314481).

SUMMARY

According to a first aspect, a device for determining an actual cell state of a resistive memory cell having a plurality M of programmable cell states is suggested. The device comprises a sensing circuit for sensing a sensing voltage of the resistive memory cell and for outputting a resultant value in response to the sensing voltage which is indicative for the actual cell state, a settling circuit including a plurality of current mirrors for settling the sensing voltage to a certain target voltage representing one of the M programmable cell states, a prebiasing circuit for prebiasing a bitline capacitance of the resistive memory cell such that the sensing voltage is close to the certain target voltage, and a resistance circuit including a plurality of resistors connected in series and coupled in parallel to the resistive memory cell, wherein the resistance circuit is configured to reduce an effective resistance seen by the prebiasing circuit, wherein the settling circuit and the resistance circuit are configured to form a plurality of current-resistor pairs being switchable to define a linear range of detection currents corresponding to the certain target voltages, each of the plurality of current-resistor pairs including one current mirror and one resistor.

According to an embodiment, the prebiasing circuit is coupled to a first node connected to a bitline of the resistive memory cell and to the resistance circuit.

According to a further embodiment, the prebiasing circuit includes a serial connection of a voltage source, a resistor and a switch for connecting and disconnecting the prebiasing circuit to the first node.

According to a further embodiment, the resistor of the prebiasing circuit has an equal or lower resistance to the resistance circuit coupled in parallel to the resistive memory cell.

According to a further embodiment, the plurality of resistors are coupled in series to each other and wherein the plurality of current mirrors are coupled in parallel to each other.

According to a further embodiment, the device comprises a comparing circuit for providing a comparison result by comparing the sensing voltage and a reference voltage.

According to a further embodiment, the comparing circuit includes a plurality of voltage comparators.

According to a further embodiment, the number of voltage comparators corresponds to the number of current-resistor pairs.

According to a further embodiment, each of the plurality of voltage comparators is allocated to one current-resistor pair.

According to a further embodiment, each of the voltage comparators provides a comparison result and wherein each comparison result is usable as a control signal for controlling switching of a corresponding current-resistor pair.

According to a further embodiment, the resistance circuit includes a plurality of switches, each of which is coupled in parallel to one of the resistors and is configured to receive the control signal and to deactivate the corresponding resistor by shortening the corresponding resistor or to activate the corresponding resistor by releasing the shortening.

According to a further embodiment, the settling circuit includes a plurality of switches, each of which is coupled in series to one of the current mirrors and is configured to receive the control signal and to deactivate the corresponding current mirror by opening the switch or to activate the corresponding current mirror by closing the switch.

According to a further embodiment, the control signals are configured to select one or more current-resistor pairs to be activated for defining a specific linear range of detection currents and enabling any possible piece-wise linear shape of the detection curve.

According to a further embodiment, the device comprises a temperature sensor for detecting a temperature of the device.

According to a further embodiment, the current-resistor pairs are coupled to the temperature sensor in a feedback loop to be adjusted according to the detected temperature.

According to a second aspect, a resistive memory device is suggested. The resistive memory device comprises a memory including a plurality of resistive memory cells having a plurality M of programmable levels, and a read/write apparatus for reading and writing data in the resistive memory cells, wherein the read/write apparatus includes a device as described above.

According to a third aspect, a method for determining an actual cell state of a resistive memory cell having a plurality M of programmable cell states is suggested. The method comprises the following steps: providing a prebiasing circuit, prebiasing a bitline capacitance of the resistive memory cell such that a sensing voltage is close to a certain target voltage which is indicative for the actual cell state, providing a resistance circuit including a plurality of resistors coupled in parallel to the resistive memory cell, wherein the resistance circuit is configured to reduce an effective resistance seen by the prebiasing circuit, settling the sensing voltage by a settling circuit to a certain target voltage representing one of the M programmable cell states, wherein the settling circuit and the resistance circuit are configured to form a plurality of current-resistor pairs being switchable to define a linear range of detection currents corresponding to the certain target voltages, each of the plurality of current-resistor pairs including one current mirror and one resistor, sensing the sensing voltage of the resistive memory cell, and outputting a resultant value in response to the sensing voltage.

According to a fourth aspect, the invention relates to a computer program comprising a program code for executing at least one step of the method of the third aspect for determining an actual cell state of a resistive memory cell when run on at least one computer.

In the following, exemplary embodiments of the present invention are described with reference to the enclosed figures.

BRIEF DESCRIPTION OF THE DRAWINGS

Similar or functionally similar elements in the figures have been allocated the same reference signs if not otherwise indicated.

DETAILED DESCRIPTION

Figure 1:
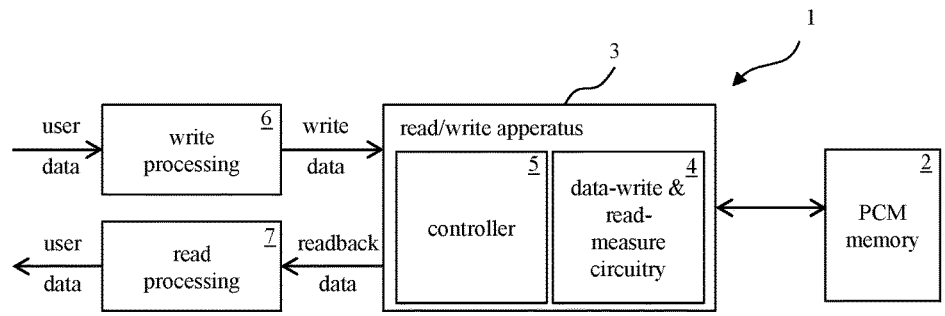
FIG. 1 shows an embodiment of a resistive memory device.

FIG. 1 is a simplified schematic of a resistive memory device 1. The resistive memory device 1 includes a phase-change memory 2 for storing data in one or more integrated arrays of multilevel PCM cells. Though shown as a single block in FIG. 1, in general memory 2 may include any desired configuration of PCM storage units ranging, for example, from a single chip or die to a plurality of storage banks each containing multiple packages of storage chips. Reading and writing of data to memory 2 is performed by read/write apparatus 3. Apparatus 3 includes data write and read-measurement circuitry 4 for writing data to the PCM cells and for making cell measurements allowing determination of cell state and hence readback of stored data.

According to some implementations, the resistive memory cell is a PCM cell (PCM, Phase Change Memory). The PCM cell may be understood as a non-linear resistive device. In particular, the memory cells and/or the reference cells form a memory array.

Circuitry 4 can address individual PCM cells for write and read purposes by applying appropriate voltage signals to an array of word and bit lines in memory ensemble 2.

This process is performed in generally known manner except as detailed hereinafter. A read/write controller 5 controls operation of apparatus 3 generally and in particular controls measurement operations in the embodiments to be described, as well as processing of measurements for determining cell state, i.e. level detection, where required. In general, the functionality of controller 5 can be implemented in hardware or software or a combination thereof, though use of hardwired logic circuits is generally preferred for reasons of operating speed. Suitable implementations will be apparent to those skilled in the art from the description herein. As indicated by block 6 in FIG. 1, user data input to device 1 is typically subjected to some form of write-processing, such as coding for error-correction purposes, before being supplied as write data to read/write apparatus 3. Similarly, readback data output by apparatus 3 is generally processed by a read-processing module 7, e.g. performing codeword detection and error correction operations, to recover the original input user data. Such processing by modules 6 and 7 is independent of the cell-state measurement system to be described and need not be discussed further here.

Each of the multilevel cells in memory 2 can be set to one of s resistance levels, where s>2, corresponding to different amorphous/crystalline states of the cell. To write data to memory cells, circuitry 4 applies programming pulses (via cell bit-lines or word-lines and using voltage-mode or current-mode programming) of appropriate amplitude to set cells to states representative of the write data. Subsequent reading of a memory cell involves determining the state of the cell, i.e. detecting which of the possible levels that cell is set to. In a read operation of memory device 1, circuitry 4 performs cell measurements from which cell-states can be determined and the stored data recovered.

Figure 2:
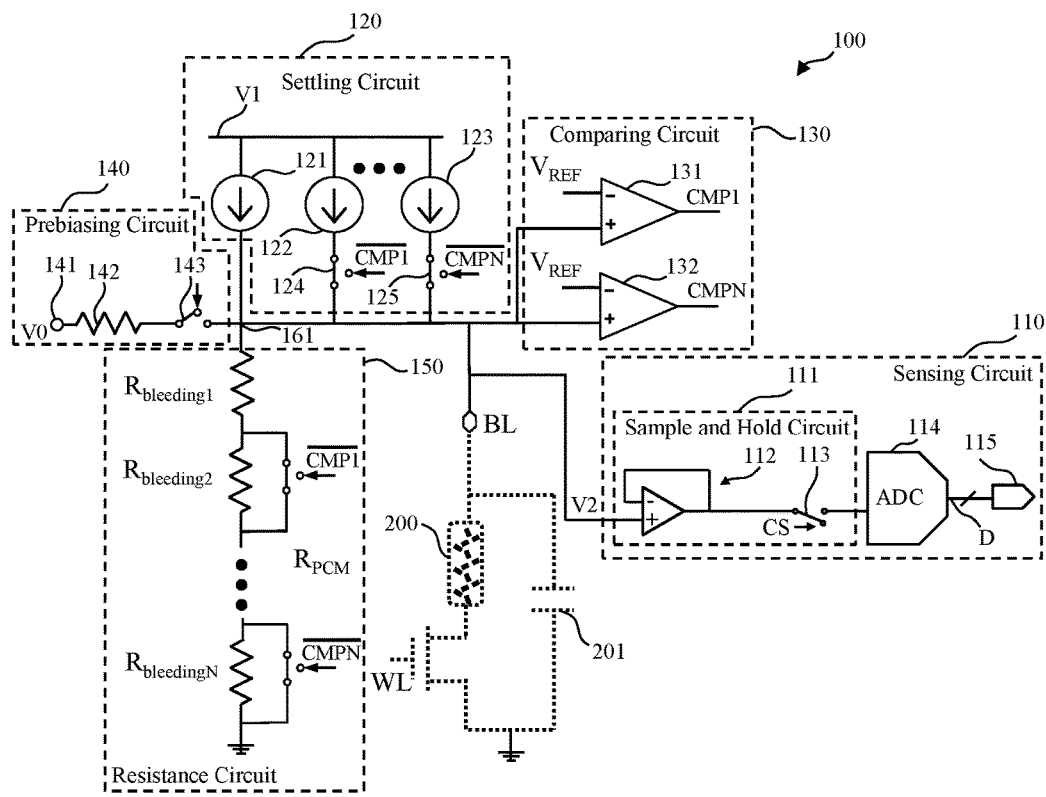
FIG. 2 shows an embodiment of a device for determining an actual cell state of a resistive memory cell.

In FIG. 2, an embodiment of a device 100 for determining an actual cell state of a resistive memory cell 200 is depicted.

A readout at high current biasing, even though such a readout significantly reduces drift impact and has better signal-to-noise ratio, may have a potential problem of read disturb where a cell state is irretrievably destroyed during the readout. Therefore, a modulation (fine tuning) of the detection curve is required for reliable readout and for avoiding any read disturb. This can be achieved by the device 100 as shown in FIG. 2.

The device 100 of FIG. 2 has a sensing circuit 110, a settling circuit 120, a comparing circuit 130, a prebiasing circuit 140 and a resistance circuit 150. The resistance circuit 150 is coupled in parallel to the resistive memory cell 200. For example, the resistive memory cell 200 is a PCM cell having a plurality M of programmable cell states.

The sensing circuit 110 is configured to sense a sensing voltage V2 of the resistive memory cell 200 and to output a resultant value D (e.g. a digital value D) in response to the sensing voltage V2. The sensing voltage V2 and therefore also the resultant value D are indicative for the actual cell state.

The sensing circuit 110 includes a sample and hold circuit 111, an analog-to-digital converter (ADC) 114 and an output 115. The sample and hold circuit 111 includes a buffer 112 and a switch 113 controlled by control signal CS.

The settling circuit 120 is configured to settle the sensing voltage V2 to a certain target voltage representing one of the M programmable cell states. The settling circuit 120 is coupled to a supply voltage V1 and includes a plurality of current mirrors 121, 122, 123 which are coupled to a line 161 via switches 124, 125.

The prebiasing circuit 140 is coupled to the line 161. The bitline BL of the PCM cell 200 is also connected to the line 161. The resistance circuit 150 is coupled in parallel to the resistive memory cell 200 and is also connected to the line 161. The resistive memory cell 200 includes a bitline BL, a bitline capacitance 201 and a wordline WL.

The prebiasing circuit 140 includes a serial connection of a voltage source 141 for providing the prebiasing voltage V0, a resistor 142 and a switch 143 for connecting and disconnecting the prebiasing circuit 140 to the line 161.

The device 100 may be coupled to a controller 5 as shown in FIG. 1. The controller 5 is configured to control the switch 143 of the prebiasing circuit 140 such that, in a prebiasing phase (or prebiasing mode), the prebiasing circuit 140 is connected to the line 161 and, in a settling phase (or settling mode), the settling circuit 120 is connected to the line 161 and the prebiasing circuit 140 is disconnected from the line 161. In a sampling mode of the device 100, switch 113 is closed and the remaining configuration corresponds to the configuration of the settling mode.

In greater detail, in the prebiasing mode (not shown), the switches 124, 125 are closed or opened, the switch 143 is closed and the switch 113 is opened. Thus, the current flows from the voltage source 141 over the line 161 to the bitline BL and therefore to the resistive memory cell 200.

Further, in the settling mode (shown in FIG. 2), the switch 143 is opened, the switches 124, 125 are closed or opened and the switch 113 is open. As a result, the current flows from the current mirrors 121, 122 or 123 to the resistive memory cell 200 over the line 161 and the bitline BL.

In the sampling mode, the switch 143 is opened, the switches 124, 125 are closed or opened and the switch 113 is closed. The controller controls the sampling by the control signal CS applied to switch 113.

The initial state of switches 124, 125 in the prebiasing mode is closed and during the prebiasing and/or settling mode as the voltage of over the line 161 increases the switches can change their state. The initial state of switches 124, 125 in the settling mode is the same as the final state of the switches in the prebiasing mode.

The resistance circuit 150 including a plurality of resistors Rbleeding1, Rbleeding2, RbleedingN and the settling circuit 120 provide current-resistor pairs. Each current-resistor pair includes one current mirror 121, 122, 123 and one resistor Rbleeding1, Rbleeding2, RbleedingN. These current-resistor pairs can be activated or deactivated using control signals CMP1, CMP2, CMPN. As can be seen, one control signal is applied to a switch connecting one current mirror 122, 123 with the line 161 and a bypass switch which is able to shortening the corresponding resistor.

The current-resistor pairs are used for allowing a plurality of piece-wise linear detection curves. By combining biasing currents and resistors in pairs each piece-wise linear detection segment may be uniquely defined. Crossing points between segments are detected using comparators 131, 132 that generate the signal for the switches 124, 125 that change the configuration by turning on and/or off different biasing current/resistor pairs. Increasing voltage over the line 161 changes the configuration of the switches 124, 125 in succession from closed to open.

By choosing biasing current/resistor pairs to be just slightly below the constant power curve (threshold current, threshold voltage product value), disturbance may be avoided and the readout range may be enhanced. Thus, higher values of SET and RESET can be detected.

Figure 3:
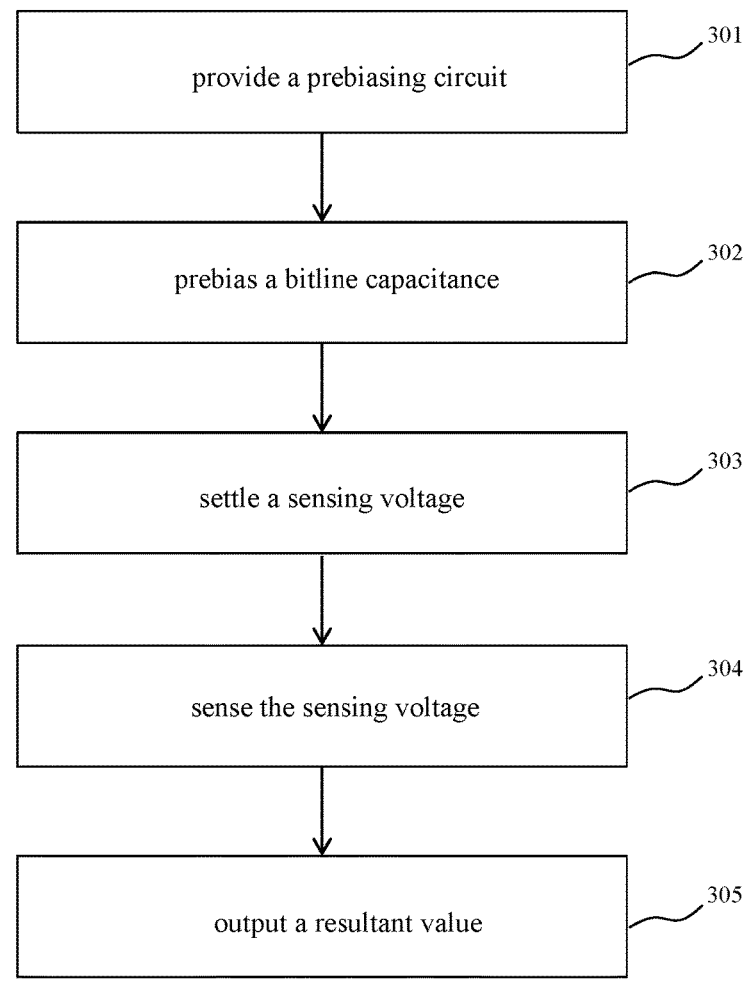
FIG. 3 shows an embodiment of a sequence of method steps for determining an actual cell state of a resistive memory cell having a plurality of programmable cell states.

FIG. 3 shows an embodiment of a sequence of method steps for determining an actual cell state of a resistive memory cell having a plurality M of programmable cell states.

In step 301, a prebiasing circuit is coupled to the resistive memory cell.

In step 302, a bitline capacitance of the resistive memory cell is prebiased by the prebiasing circuit such that a sensing voltage of the resistive memory cell is close to a certain target voltage which is indicative for the actual cell state.

In step 303, the sensing voltage is settled to the certain target voltage using current-resistor pairs as described with reference to FIG. 2.

In step 304, the sensing voltage of the resistive memory cell is sensed by a sensing circuit.

In step 305, a resultant value is output in response to the sensing voltage.

Computerized devices may be suitably designed for implementing embodiments of the present invention as described herein. In that respect, it may be appreciated that the method described herein is largely non-interactive and automated. In exemplary embodiments, the method described herein may be implemented either in an interactive, partly-interactive or non-interactive system. The method described herein may be implemented in software (e.g., firmware), hardware, or a combination thereof. In exemplary embodiments, the method described herein is implemented in software, as an executable program, the latter executed by suitable digital processing devices. In further exemplary embodiments, at least one step or all steps of above method of FIG. 3 may be implemented in software, as an executable program, the latter executed by suitable digital processing devices. More generally, embodiments of the present invention may be implemented wherein general-purpose digital computers, such as personal computers, workstations, etc., are used.

Figure 4:
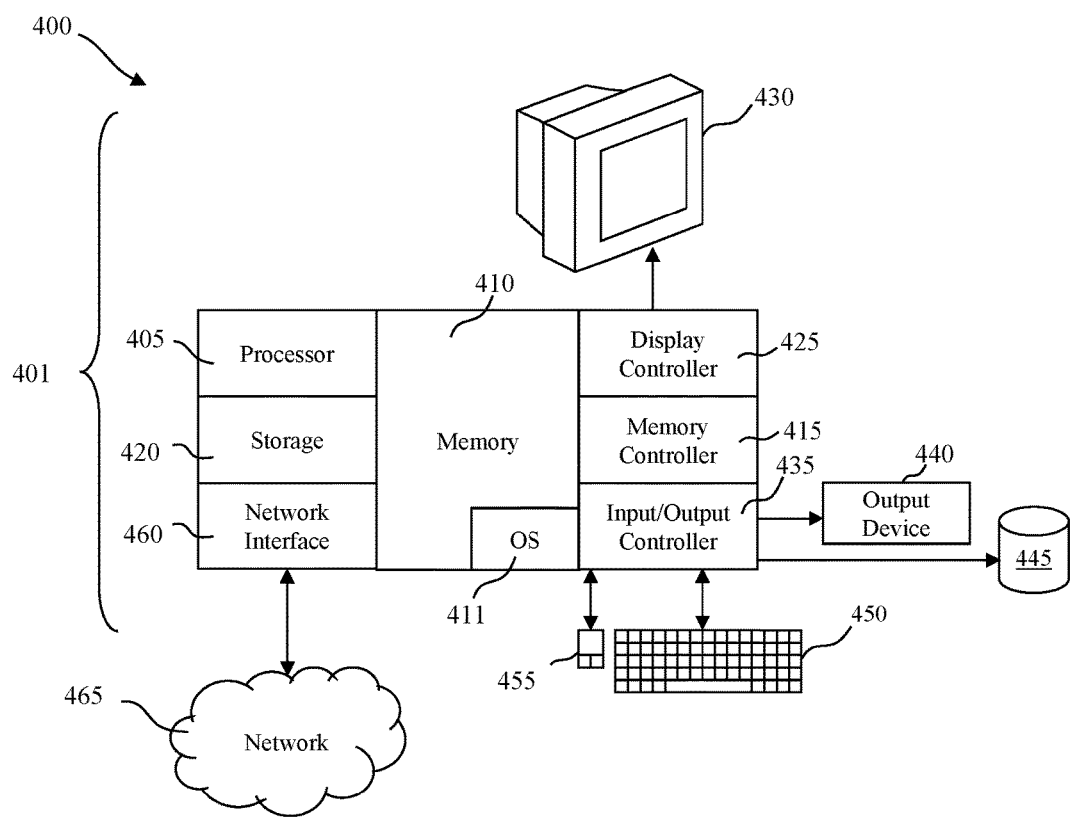
FIG. 4 shows a schematic block diagram of an embodiment of a system adapted for performing the method for read measurement of a plurality of resistive memory.

For instance, the system 400 depicted in FIG. 4 schematically represents a computerized unit 401, e.g., a general-purpose computer. In exemplary embodiments, in terms of hardware architecture, as shown in FIG. 4, the unit 401 includes a processor 405, memory 410 coupled to a memory controller 415, and one or more input and/or output (I/O) devices 440, 445, 450, 455 (or peripherals) that are communicatively coupled via a local input/output controller 435. The input/output controller 435 can be, but is not limited to, one or more buses or other wired or wireless connections, as is known in the art. The input/output controller 435 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 405 is a hardware device for executing software, particularly that stored in memory 410. The processor 405 can be any custom made or commercially available processor, a central processing unit (CPU), an auxiliary processor among several processors associated with the computer 401, a semiconductor based microprocessor (in the form of a microchip or chip set), or generally any device for executing software instructions.

The memory 410 can include any one or combination of volatile memory elements (e.g., random access memory) and nonvolatile memory elements. Moreover, the memory 410 may incorporate electronic, magnetic, optical, and/or other types of storage media. Note that the memory 410 can have a distributed architecture, where various components are situated remote from one another, but can be accessed by the processor 405.

The software in memory 410 may include one or more separate programs, each of which comprises an ordered listing of executable instructions for implementing logical functions. In the example of FIG. 4, the software in the memory 410 includes methods described herein in accordance with exemplary embodiments and a suitable operating system (OS) 411. The OS 411 essentially controls the execution of other computer programs, such as the method as described herein (e.g., FIG. 3), and provides scheduling, input-output control, file and data management, memory management, and communication control and related services.

The method described herein may be in the form of a source program, executable program (object code), script, or any other entity comprising a set of instructions to be performed. When in a source program form, then the program needs to be translated via a compiler, assembler, interpreter, or the like, as known per se, which may or may not be included within the memory 410, so as to operate properly in connection with the OS 411. Furthermore, the method can be written as an object oriented programming language, which has classes of data and methods, or a procedure programming language, which has routines, subroutines, and/or functions.

Possibly, a conventional keyboard 450 and mouse 455 can be coupled to the input/output controller 435 (in particular for the BS, if needed). Other I/O devices 440-455 may include sensors (especially in the case of network elements), i.e., hardware devices that produce a measurable response to a change in a physical condition like temperature or pressure (physical data to be monitored). Typically, the analog signal produced by the sensors is digitized by an analog-to-digital converter and sent to controllers 435 for further processing. Sensor nodes are ideally small, consume low energy, are autonomous and operate unattended.

In addition, the I/O devices 440-455 may further include devices that communicate both inputs and outputs. The system 400 can further include a display controller 425 coupled to a display 440. In exemplary embodiments, the system 400 can further include a network interface or transceiver 460 for coupling to a network 465.

The network 465 transmits and receives data between the unit 401 and external systems. The network 465 is possibly implemented in a wireless fashion, e.g., using wireless protocols and technologies, such as WiFi, WiMax, etc. The network 465 may be a fixed wireless network, a wireless local area network (LAN), a wireless wide area network (WAN) a personal area network (PAN), a virtual private network (VPN), intranet or other suitable network system and includes equipment for receiving and transmitting signals.

The network 465 can also be an IP-based network for communication between the unit 401 and any external server, client and the like via a broadband connection. In exemplary embodiments, network 465 can be a managed IP network administered by a service provider. Besides, the network 465 can be a packet-switched network such as a LAN, WAN, Internet network, etc.

If the unit 401 is a PC, workstation, intelligent device or the like, the software in the memory 410 may further include a basic input output system (BIOS). The BIOS is stored in ROM so that the BIOS can be executed when the computer 401 is activated.

When the unit 401 is in operation, the processor 405 is configured to execute software stored within the memory 410, to communicate data to and from the memory 410, and to generally control operations of the computer 401 pursuant to the software. The method described herein and the OS 411, in whole or in part are read by the processor 405, typically buffered within the processor 405, and then executed. When the method described herein is implemented in software, the method can be stored on any computer readable medium, such as storage 420, for use by or in connection with any computer related system or method.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

More generally, while the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope. Therefore, it is intended that the present invention not be limited to the particular embodiments disclosed, but that the present invention will include all embodiments falling within the scope of the appended claims.

REFERENCE SIGNS 1 measurement apparatus
2 PCM memory
3 read/write apparatus
4 data-write and read-measure circuitry
5 controller
6 write processing
7 read processing
100 device
110 sensing circuit
111 sample and hold circuit
112 buffer
113 switch
114 analog-to-digital converter
115 output
120 settling circuit
121, 122, 123 current mirror
124, 125 switch
130 comparing circuit
131, 132 comparator
140 prebiasing circuit
141 voltage source
142 resistor
143 switch
150 resistance circuit
161 first node
200 resistive memory cell
201 bitline capacitance
301-305 method steps
400 system
401 computerized unit
405 processor
410 memory
411 operating system (OS)
415 memory controller
420 storage
425 display controller
440 display
445, 450, 455 input and/or output (I/O) devices
435 local input/output controller
450 keyboard
455 mouse
460 network interface or transceiver
465 network
D resultant value
CMP1, CMPN control signal
Rbleeding1, Rbleeding2, RbleedingN resistor
RPCM memory cell resistance
CS sampling signal
V0 biasing voltage
V1 supply voltage
V2 sensing voltage
VREF reference voltage

What is claimed is:

1. A device for determining an actual cell state of a resistive memory cell having a plurality M of programmable cell states, the device comprising:
   a sensing circuit configured to sense a sensing voltage of the resistive memory cell and to output a resultant value in response to the sensing voltage which is indicative of the actual cell state,
   a settling circuit, including a plurality of current mirrors, configured to settle the sensing voltage to a certain target voltage representing one of the M programmable cell states,
   a prebiasing circuit configured to pre-bias a bitline capacitance of the resistive memory cell such that the sensing voltage is close to the certain target voltage, and
   a resistance circuit including a plurality of resistors connected in series and coupled in parallel to the resistive memory cell, wherein the resistance circuit is configured to reduce an effective resistance seen by the prebiasing circuit, wherein the settling circuit and the resistance circuit are configured to form a plurality of current-resistor pairs being switchable to define a linear range of detection currents corresponding to the certain target voltages, each of the plurality of current-resistor pairs including one current mirror of the plurality of current mirrors and one resistor.

2. The device of claim 1, wherein the prebiasing circuit is coupled to a first node connected to a bitline of the resistive memory cell and to the resistance circuit.

3. The device of claim 2, wherein the prebiasing circuit includes a serial connection of a voltage source, a resistor and a switch for connecting and disconnecting the prebiasing circuit to the first node.

4. The device of claim 3, wherein the resistor of the prebiasing circuit has an equal or lower resistance compared to the resistance circuit coupled in parallel to the resistive memory cell.

5. The device of claim 1, wherein the plurality of resistors are coupled in series to each other and wherein the plurality of current mirrors are coupled in parallel to each other.

6. The device of claim 5, further comprising a comparing circuit configured to provide a comparison result by comparing the sensing voltage and a reference voltage.

7. The device of claim 6, wherein the comparing circuit includes a plurality of voltage comparators.

8. The device of claim 7, wherein the number of voltage comparators corresponds to the number of current-resistor pairs.

9. The device of claim 8, wherein each of the plurality of voltage comparators is allocated to one current-resistor pair.

10. The device of claim 9, wherein each of the voltage comparators provides a comparison result and wherein each comparison result is usable as a control signal for controlling switching of a corresponding current-resistor pair.

11. The device of claim 10, wherein the resistance circuit includes a plurality of switches, each of which is coupled in parallel to one of the resistors and is configured to receive the control signal and to deactivate the corresponding resistor by shortening the corresponding resistor or to activate the corresponding resistor by releasing the shortening.

12. The device of claim 10, wherein the settling circuit includes a plurality of switches, each of which is coupled in series to one of the current mirrors.

13. A resistive memory device, comprising:
a memory including a plurality of resistive memory cells having a plurality M of programmable levels, and
a read/write apparatus configured to read and write data in the resistive memory cells, wherein the read/write apparatus includes a read device for determining an actual cell state of a resistive memory cell having a plurality M of programmable cell states, the read device comprising:
a sensing circuit configured to sense a sensing voltage of the resistive memory cell and to output a resultant value in response to the sensing voltage which is indicative of the actual cell state,
a settling circuit including a plurality of current mirrors configured to settle the sensing voltage to a certain target voltage representing one of the M programmable cell states,
a prebiasing circuit configured to pre-bias a bitline capacitance of the resistive memory cell such that the sensing voltage is close to the certain target voltage, and
a resistance circuit including a plurality of resistors connected in series and coupled in parallel to the resistive memory cell, wherein the resistance circuit is configured to reduce an effective resistance seen by the prebiasing circuit,
wherein the settling circuit and the resistance circuit are configured to form a plurality of current-resistor pairs being switchable to define a linear range of detection currents corresponding to the certain target voltages, each of the plurality of current-resistor pairs including one current mirror of the plurality of current mirrors and one resistor.

14. A method for determining an actual cell state of a resistive memory cell having a plurality M of programmable cell states, the method comprising:
prebiasing a bitline capacitance of the resistive memory cell such that a sensing voltage is close to a certain target voltage which is indicative of the actual cell state,
wherein an effective resistance seen by a prebiasing circuit is reduced by a resistance circuit, the resistance circuit including a plurality of resistors coupled in parallel to the resistive memory cell,
settling the sensing voltage by a settling circuit to a certain target voltage representing one of the M programmable cell states, wherein the settling circuit and the resistance circuit are configured to form a plurality of current-resistor pairs being switchable to define a linear range detection currents corresponding to the certain target voltages, each of the plurality of current-resistor pairs including one current mirror of the plurality of current mirrors and one resistor,
sensing the sensing voltage of the resistive memory cell, and
outputting a resultant value in response to the sensing voltage.

* * * * *